United States Patent
Yang

(10) Patent No.: US 9,069,533 B2
(45) Date of Patent: Jun. 30, 2015

(54) DATA CENTER CONTAINER WITH DRAINING MECHANISM

(71) Applicant: Xu Yang, Shenzhen (CN)

(72) Inventor: Xu Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 343 days.

(21) Appl. No.: 13/677,305

(22) Filed: Nov. 15, 2012

(65) Prior Publication Data

US 2013/0229769 A1     Sep. 5, 2013

(30) Foreign Application Priority Data

Mar. 5, 2012   (CN) .......................... 2012 1 0054986

(51) Int. Cl.
*H05K 7/14* (2006.01)
*F25D 21/14* (2006.01)
*H05K 7/20* (2006.01)
*G06F 1/20* (2006.01)

(52) U.S. Cl.
CPC ............... *G06F 1/20* (2013.01); *H05K 7/1497* (2013.01); *G06F 2200/201* (2013.01)

(58) Field of Classification Search
CPC ................................................ H05K 7/1497
See application file for complete search history.

(56) References Cited

U.S. PATENT DOCUMENTS

| | | | | |
|---|---|---|---|---|
| 7,511,960 B2 * | 3/2009 | Hillis et al. | .................... | 361/702 |
| 7,551,971 B2 * | 6/2009 | Hillis | ............... | 700/90 |
| 7,738,251 B2 * | 6/2010 | Clidaras et al. | ............... | 361/701 |
| 7,852,627 B2 * | 12/2010 | Schmitt et al. | ................ | 361/695 |
| 7,854,652 B2 * | 12/2010 | Yates et al. | .................... | 454/184 |
| 7,856,838 B2 * | 12/2010 | Hillis et al. | .................. | 62/259.2 |
| 7,894,945 B2 * | 2/2011 | Hillis | ........................... | 700/276 |
| 7,990,710 B2 * | 8/2011 | Hellriegel et al. | ............ | 361/699 |
| 8,046,896 B2 * | 11/2011 | Schmitt et al. | .................. | 29/469 |
| 8,047,904 B2 * | 11/2011 | Yates et al. | .................... | 454/118 |
| 8,251,785 B2 * | 8/2012 | Schmitt et al. | ................ | 454/184 |
| 8,743,543 B2 * | 6/2014 | Clidaras et al. | ............... | 361/701 |
| 8,833,094 B2 * | 9/2014 | Hellriegel et al. | ............. | 62/186 |
| 8,842,420 B2 * | 9/2014 | Driggers | ....................... | 361/601 |
| 8,842,430 B2 * | 9/2014 | Hellriegel et al. | ........ | 361/679.46 |
| 8,938,983 B2 * | 1/2015 | Yang | ........................... | 62/259.2 |
| 2010/0091449 A1 * | 4/2010 | Clidaras et al. | .......... | 361/679.49 |
| 2012/0140415 A1 * | 6/2012 | Driggers | ....................... | 361/692 |
| 2012/0302150 A1 * | 11/2012 | Schmitt et al. | ................ | 454/184 |
| 2013/0243037 A1 * | 9/2013 | Yang | ............................. | 374/208 |

* cited by examiner

*Primary Examiner* — Robert J Hoffberg

(74) *Attorney, Agent, or Firm* — Novak Druce Connolly Bove + Quigg LLP

(57) ABSTRACT

A data center container includes a chassis, a cooling system, a draining mechanism, and a latching member. The chassis includes a front plate with a securing hole. The cooling system includes a water tray and a drainer tray. The water tray communicates with the drainer tray. The draining mechanism communicates with the drainer tray and extends out of the chassis. The latching member is attached to the draining mechanism. The latching member includes an inserting post, and the inserting post being engaged in the securing hole, to position the draining mechanism to the front plate.

20 Claims, 5 Drawing Sheets

DATA CENTER CONTAINER WITH DRAINING MECHANISM

BACKGROUND

1. Technical Field

The present disclosure relates to data center containers, and particularly to a data center container with a draining mechanism.

2. Description of Related Art

A plurality of racks with servers is located in a data center container. A water cooling system is used in the data center container for removing high heat from the data center container. Generally, the water cooling system includes a water inlet, a heat exchanger, a water outlet and a draining mechanism. Water flows into the heat exchanger via the water inlet and flows into the draining mechanism through the water outlet. The draining mechanism then drains the water out of the data center container. However, the draining mechanism is welded to the water outlet, which makes it hard to disassemble or assemble when the draining mechanism is needed to be replaced or amended.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
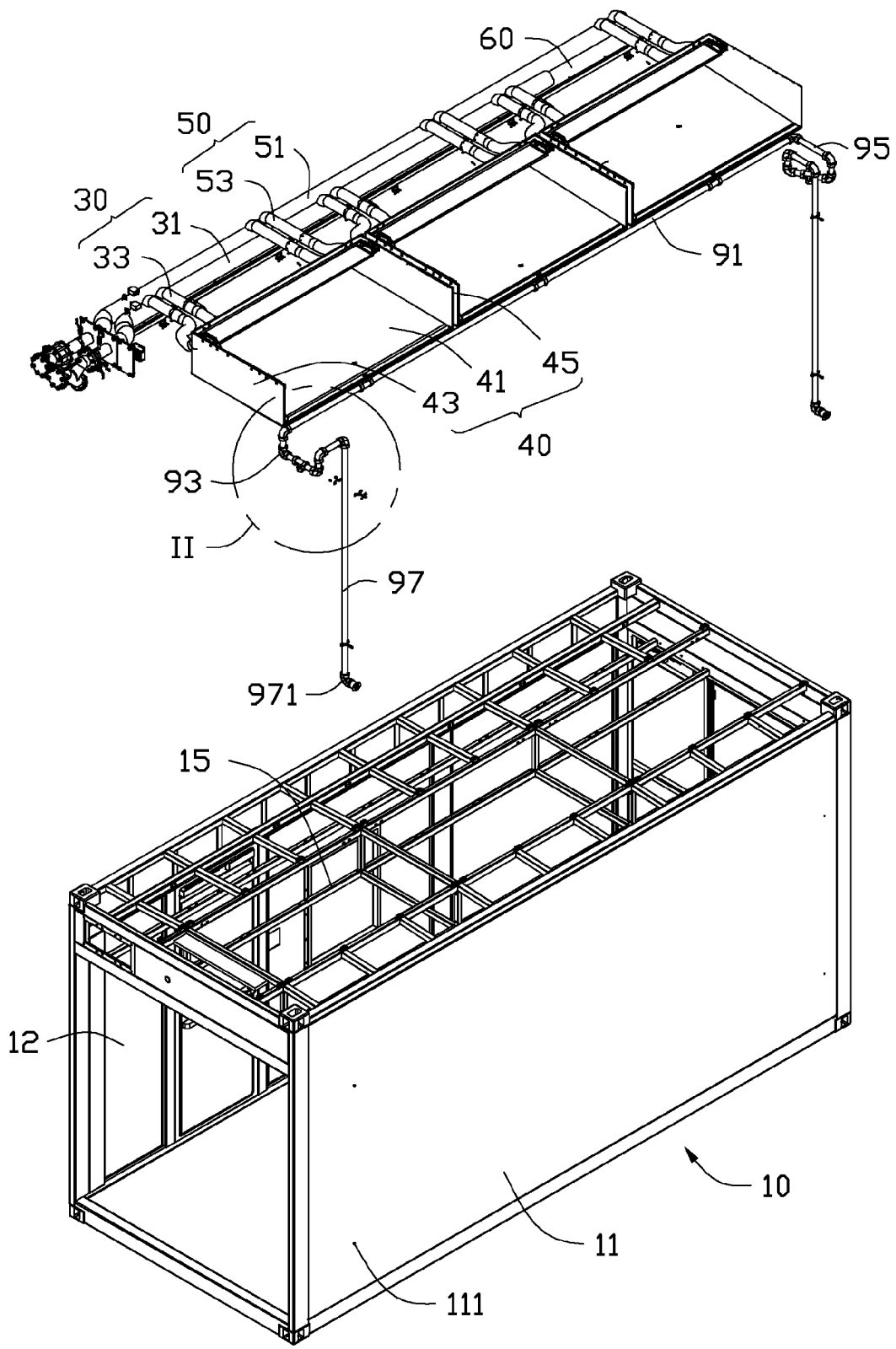
FIG. 1 is an exploded, isometric view of an embodiment of a data center container, but a cover is not shown.
Figure 2:
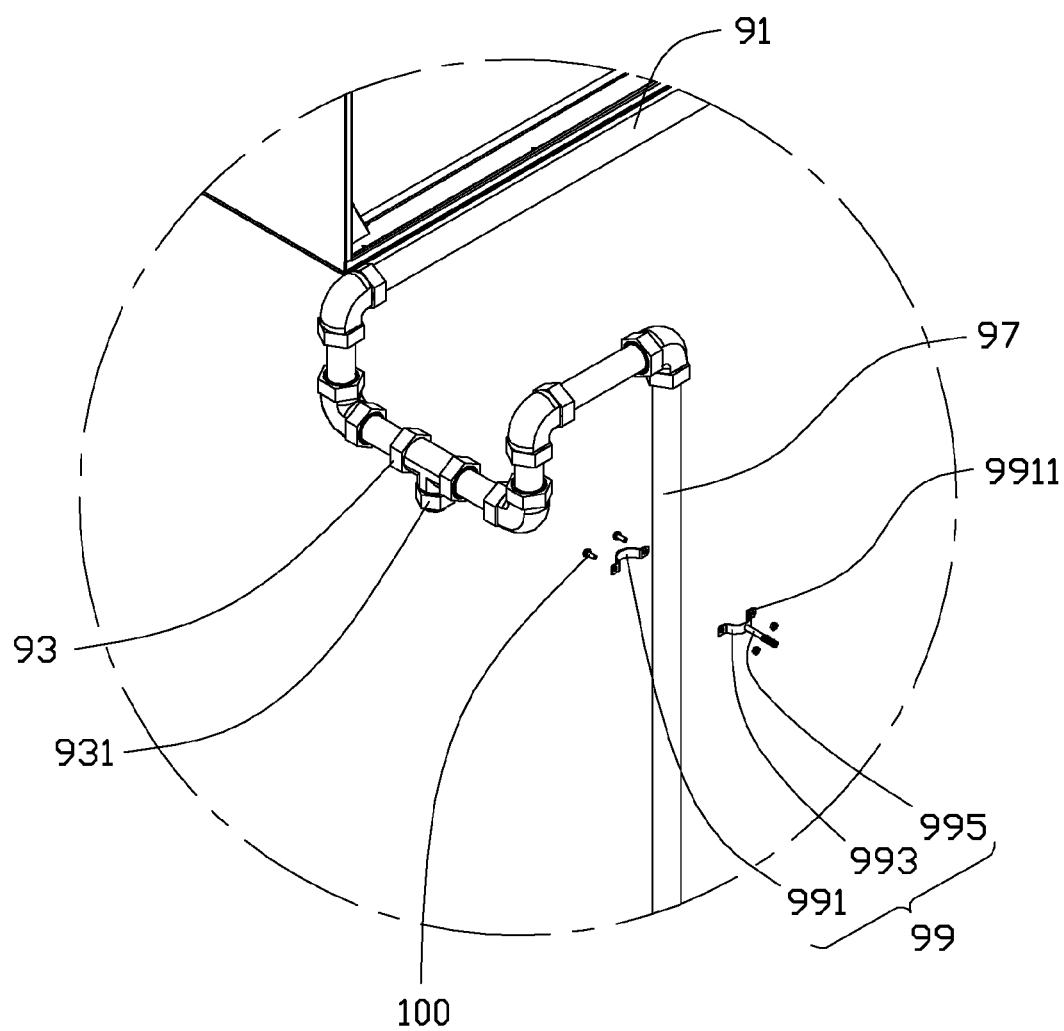
FIG. 2 is an enlarged view of a circled portion II of FIG. 1.
Figure 3:
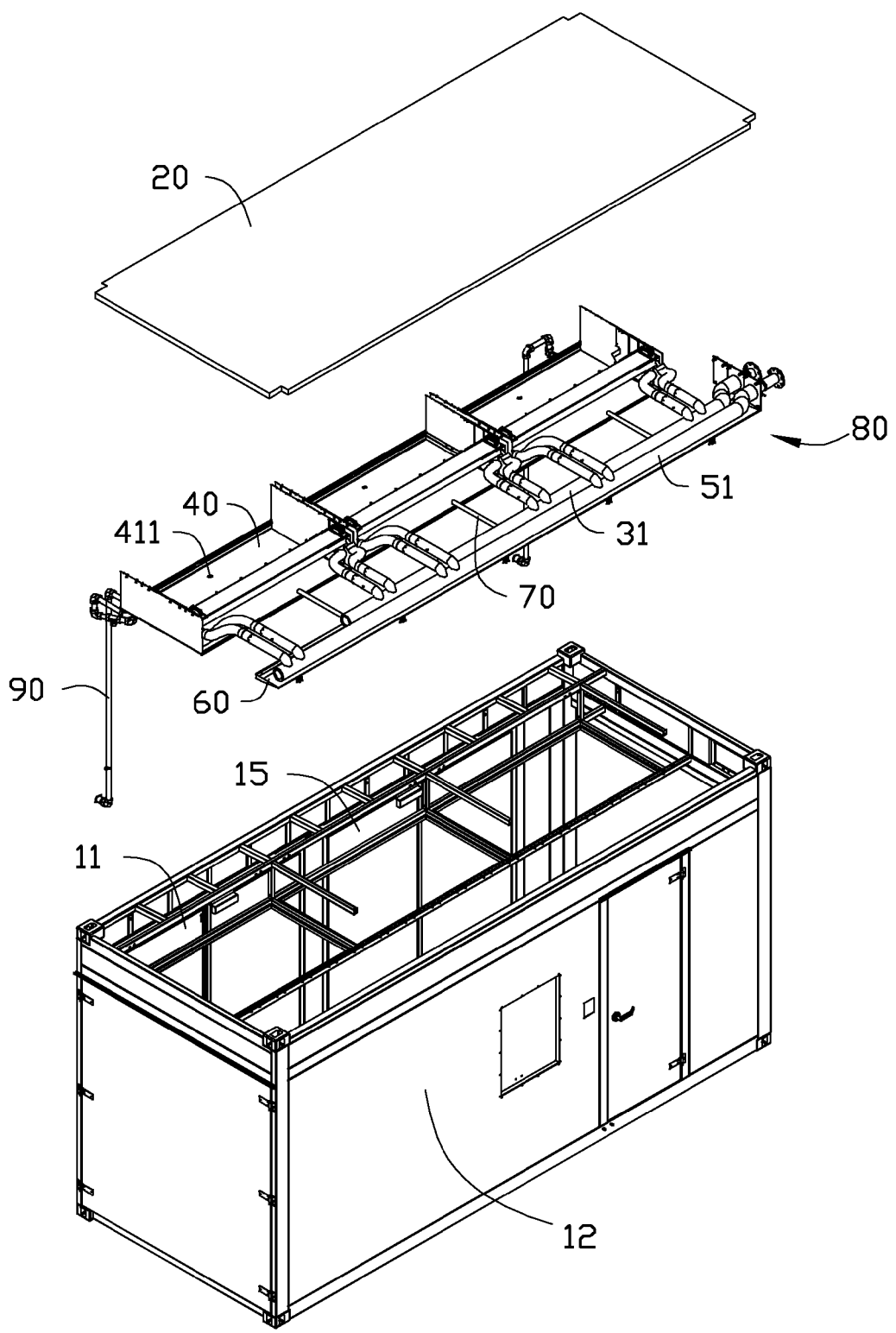
FIG. 3 is another exploded view of the container of FIG. 1, but the cover is shown.

FIGS. 1-3 illustrate a data center container in accordance with an embodiment. The data center container comprises a chassis 10, a cover 20, a cooling system 80 and a draining mechanism 90.

The chassis 10 comprises a front plate 11, a rear plate 12 and a frame 15. In one embodiment, the front plate 11 is substantially parallel to the rear plate 12. The front plate 11 defines four securing holes 111 corresponding to the draining mechanism 90. The four securing holes 111 are arranged at four corners of a rectangle. Two outlet holes (not shown), below the four securing holes 111, are defined in the front plate 11, for allowing water to flow out of the chassis 10. The frame 15, located on a top portion of the chassis 10, is secured between the front plate 11 and the rear plate 12. The cooling system 80 can be attached to the frame 15.

The cover 20 can be secured to the chassis 10, for closing the chassis 10.

The cooling system 80 comprises a water inflow portion 30, a plurality of drain trays 40, a water outflow portion 50, a water tray 60, and a plurality of connecting pipes 70.

The water inflow portion 30 comprises a first water inlet 31 and a plurality of second water inlets 33 connected to the first water inlet 31. The first water inlet 31 connects to a water source (not shown).

Each drain tray 40 comprises a bottom wall 41, a first sidewall 43, and a second sidewall 45 secured to the bottom wall 41. In one embodiment, the bottom wall 41 is substantially perpendicular to the first side wall 43 and the second sidewall 45, and the first sidewall 43 is substantially parallel to the second sidewall 45. The bottom wall 41 defines a water hole 411. Each drain tray 40 can be used for installing two heat exchangers (not shown). Each second water inlet 33 connects one of the two heat exchangers.

The water outflow portion 50 comprises a first water outflow pipe 51 and a plurality of second water outflow pipes 53. The plurality of second water outflow pipes 53 are secured to the second sidewall 45. The first water outflow pipe 51 extends out of the chassis 10.

The connecting pipes 70 are secured to the water tray 60, and place the water tray 60 in communication with the drain tray 40. Water flows into the drain tray 40 from the water tray 60 via the connecting pipe 70.

The draining mechanism 90 includes a long pipe 91, a first linking pipe 93, a second linking pipe 95, and two drainpipes 97. A plurality of converting pipes 413 (shown in FIG. 4) is located on the long pipe 91. Each converting pipe 413 can communicate with the water hole 411 of the drain tray 40. The first linking pipe 93 and the second linking pipe 95 are coupled with two opposite ends of the long pipe 91 respectively. In one embodiment, the first linking pipe 93 is substantially U-shaped. The first linking pipe 93 and the second linking pipe 95 can prevent material from blocking up the long pipe 91. The first linking pipe 93 has a controlling portion 931. The material can be discharged out of the draining mechanism 90 after unscrewing the controlling portion 931. A drain outlet 971 is located on a distal end of each of the two drainpipes 97. The drain outlet 971 communicates with each of the two outlet holes. The draining mechanism 90 further comprises two latching members 99 attached to the two drainpipes 97.

Each of the latching members 99 includes a first clipping portion 991, a second clipping portion 993 and an inserting post 995. In one embodiment, the first clipping portion 991 and the second clipping portion 993 are substantially semi-circular. Two locking pieces 9911 are located on two ends of each of the first clipping portion 991 and the second clipping portion 993. Each of the two locking pieces 9911 defines a locking hole (not labeled). The first clipping portion 991 and the second clipping portion 993 clamp each of the two drainpipes 97 from both sides. The two locking pieces 9911 of the first clipping portion 991 respectively abuts against the two locking pieces 9911 of the second clipping portion 993. A fastener 100, such as a screw, is locked into the locking hole of each of the two locking pieces 9911, to secure each of the two latching members 99 to each of the two drainpipes 97.

Figure 4:
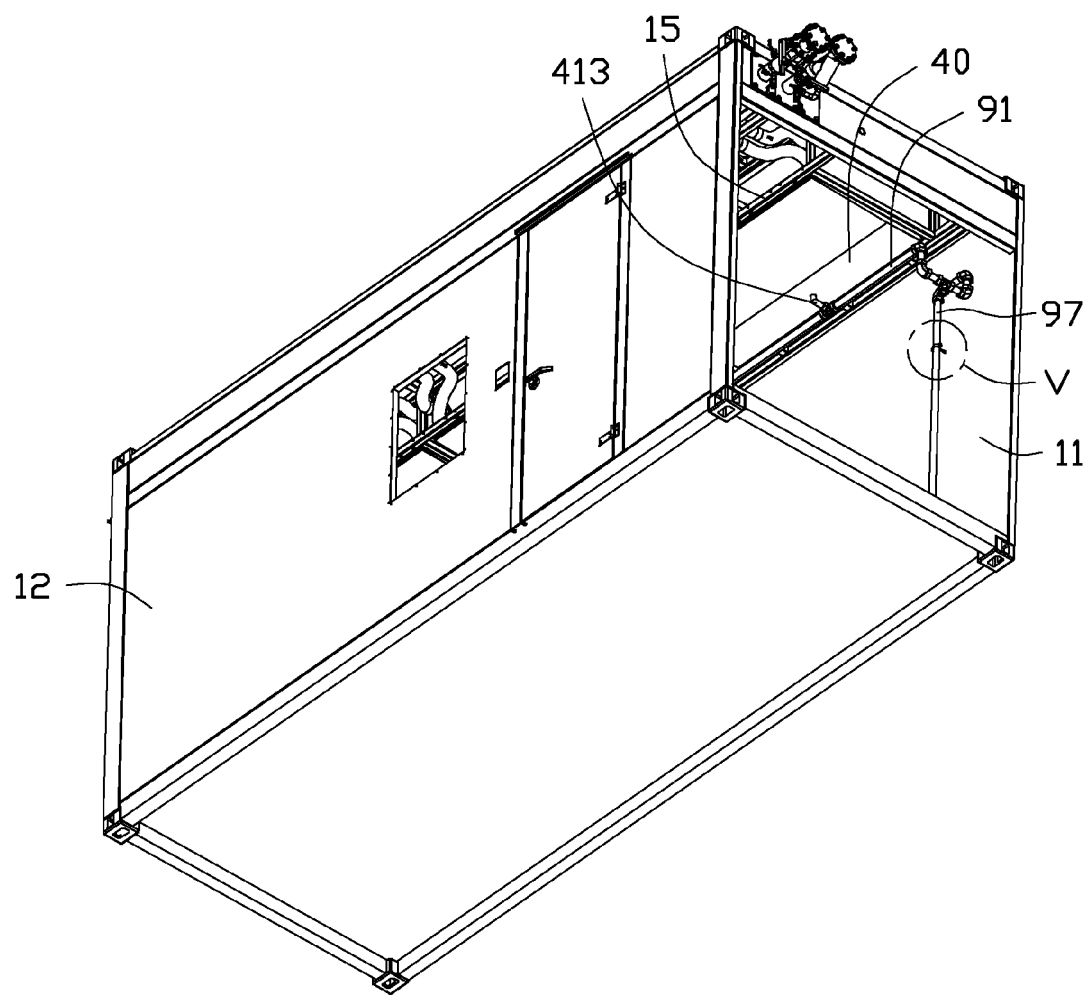
FIG. 4 is an assembled view of FIG. 3.
Figure 5:
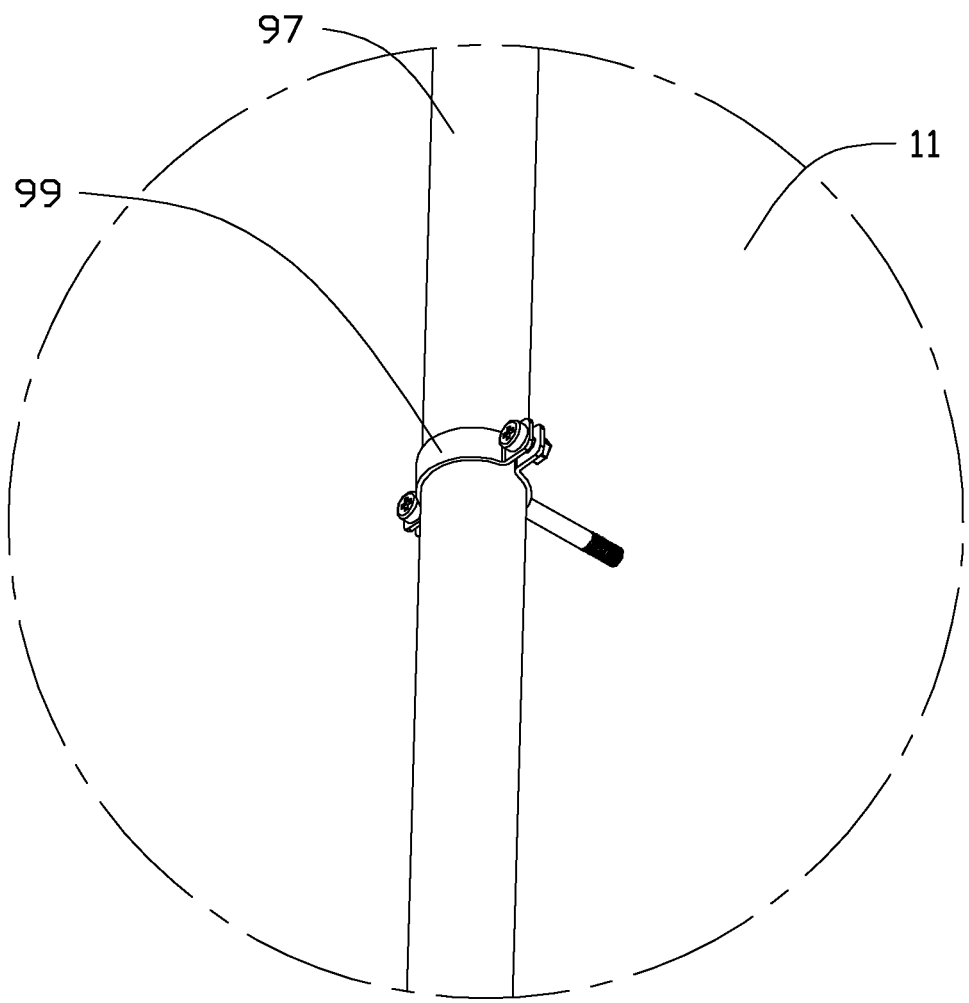
FIG. 5 is an enlarged view of a circled portion V of FIG. 4.

FIG. 4 and FIG. 5 show that in assembly, the drain tray 40 and the water tray 60 are attached to the frame 15. The water inflow portion 30 and the water outflow portion 50 are secured to the cover 20. The water tray 60 is located below the water inflow portion 30 and the water outflow portion 50. Each drain outlet 971 communicates with each outlet hole of the front plate 11. Each inserting post 995 is inserted into each securing hole 111, to position the draining mechanism 90 to the front plate 11. In this position, each converting pipe 413 communicates with each water hole 411. Thus, the draining mechanism 90 is secured to the front plate 11. When the draining mechanism 90 needs to be replaced, or maintained, the inserting post 995 is pulled and is disengaged from the securing hole 111. The draining mechanism 90 is easily detached from the front plate 11.

In use, cold water flows into the cooling system 80 through the first water inlet 31 and flows into the heat exchanger through the second water inlet 33. Heated water from the heat exchanger flows out of the chassis 10 through the water outflow portion 50. In this process, condensation generated on outer surfaces of the water inflow portion 30 and the water outflow portion 50, drops in the water tray 60 and flows into the drain tray 40 through the connecting pipe 70. The condensation in the drain tray 40 flows out of the chassis 10 through the draining mechanism 90.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A data center container comprising:
a chassis, the chassis comprises a front plate, the front plate defining a securing hole;
a cooling system located in the chassis, the cooling system comprises a water tray and a drainer tray; the water tray communicating with the drainer tray;
a draining mechanism, the draining mechanism communicates with the drainer tray and extends out of the chassis; and
a latching member, the latching member is attached to the draining mechanism, the latching member comprises an inserting post; and the inserting post is engaged in the securing hole, to position the draining mechanism on the front plate.

2. The data center container of claim 1, wherein the latching member further comprises a first clipping portion and a second clipping portion, the draining mechanism comprises a drainpipe, and the first clipping portion and the second clipping portion clamp the drainpipe therebetween.

3. The data center container of claim 2, wherein the first clipping portion and the second clipping portion are substantially semicircular.

4. The data center container of claim 1, wherein the cooling system further comprises a connecting pipe secured to the water tray, the water tray and the drainer tray are secured to the chassis, and the connecting pipe connects the water tray with the drainer tray.

5. The data center container of claim 4 further comprising a cover, wherein the cooling system further comprises a water inflow portion and a water outflow portion; the water inflow portion and the water outflow portion are located between the cover and the water tray; and the water tray is configured for receiving water dropped from the water inflow portion and the water outflow portion.

6. The data center container of claim 5, wherein the drainer tray comprises a bottom wall, a first sidewall and a second sidewall extending from the bottom wall; the first sidewall is substantially parallel to the second sidewall, and the bottom wall is substantially perpendicular to the first sidewall.

7. The data center container of claim 6, wherein the bottom wall defines a water hole, the draining mechanism further comprises a long pipe and a converting pipe, and the converting pipe connects the water hole with the long pipe, for flowing water into the long pipe from the drainer tray.

8. The data center container of claim 7, wherein the draining mechanism further comprises a first linking pipe and a second linking pipe, the first linking pipe and the second linking pipe are coupled with the long pipe respectively.

9. The data center container of claim 8, wherein the first linking pipe is substantially U-shaped.

10. The data center container of claim 6, wherein the water inflow portion is secured to the first sidewall, and the water outflow portion is secured to the second sidewall.

11. A data center container comprising:
a chassis, the chassis comprises a front plate, the front plate defining a securing hole;
a cooling system located in the chassis, the cooling system comprises a water tray and a drainer tray; the water tray connects with the drainer tray;
a draining mechanism, the draining mechanism communicates with the drainer tray and extends out of the chassis, the draining mechanism comprises a drainpipe; and
a latching member, the latching member attached to the drainpipe, the latching member comprises an inserting post; and the inserting post being engaged in the securing hole, to position the draining mechanism to the front plate.

12. The data center container of claim 11, wherein the latching member further comprises a first clipping portion and a second clipping portion, and the first clipping portion and the second clipping portion clamp the drainpipe from both sides.

13. The data center container of claim 12, wherein the first clipping portion and the second clipping portion are both substantially semicircular.

14. The data center container of claim 11, wherein the cooling system further comprises a connecting pipe secured to the water tray; the water tray and the drainer tray are secured to the chassis, and the connecting pipe connects the water tray with the drainer tray.

15. The data center container of claim 14 further comprising a cover, wherein the cooling system further comprises a water inflow portion and a water outflow portion; the water inflow portion and the water outflow portion are located between the cover and the water tray; and the water tray is configured for receiving water dropped from the water inflow portion and the water outflow portion.

16. The data center container of claim 15, wherein the drainer tray comprises a bottom wall, a first sidewall and a second sidewall extending from the bottom wall; the first sidewall is substantially parallel to the second sidewall, and the bottom wall is substantially perpendicular to the first sidewall.

17. The data center container of claim 16, wherein the bottom wall defines a water hole, the draining mechanism further comprises a long pipe and a converting pipe, and the converting pipe communicates the water hole with the long pipe, for flowing water into the long pipe from the drainer tray.

18. The data center container of claim 17, wherein the draining mechanism further comprises a first linking pipe and a second linking pipe, the first linking pipe and the second linking pipe are coupled with the long pipe respectively.

19. The data center container of claim 18, wherein the first linking pipe is substantially U-shaped.

20. The data center container of claim 16, wherein the water inflow portion is secured to the first sidewall, and the water outflow portion is secured to the second sidewall.

\* \* \* \* \*